United States Patent
Baumeister et al.

(10) Patent No.: US 10,197,251 B2
(45) Date of Patent: Feb. 5, 2019

(54) FASTENING ELEMENT FOR FIXATING TWO COMPONENTS AT EACH OTHER

(71) Applicant: BJB GmbH & Co. KG, Arnsberg (DE)

(72) Inventors: Olaf Baumeister, Sundern (DE); Herbert Beleke, Arnsberg (DE); Karl-Wilhelm Vogt, Ense (DE); Detlef Scholz, Soest (DE)

(73) Assignee: BJB GmbH & Co. KG, Arnsberg (DE)

( * ) Notice: Subject to any disclaimer, the term of this patent is extended or adjusted under 35 U.S.C. 154(b) by 595 days.

(21) Appl. No.: 14/929,632

(22) Filed: Nov. 2, 2015

(65) Prior Publication Data

US 2016/0230794 A1   Aug. 11, 2016

Related U.S. Application Data

(63) Continuation of application No. PCT/DE2014/200230, filed on May 21, 2014.

(30) Foreign Application Priority Data

Jul. 15, 2013   (DE) .................... 20 2013 006 325 U
Jul. 15, 2013   (DE) .................... 20 2013 006 326 U
(Continued)

(51) Int. Cl.
*F16B 5/06*      (2006.01)
*F21V 19/00*    (2006.01)
(Continued)

(52) U.S. Cl.
CPC ............. *F21V 19/004* (2013.01); *F16B 2/24* (2013.01); *F16B 2/241* (2013.01); *F16B 5/06* (2013.01);
(Continued)

(58) Field of Classification Search
CPC ........ F21V 19/004; F21V 29/70; Y10T 24/42; Y10T 24/304; H05K 7/1417;
(Continued)

(56) References Cited

U.S. PATENT DOCUMENTS 2,048,812 A * 7/1936 Piace .................. B60R 13/0206
                                                              24/458
2,128,004 A * 8/1938 Lombard .............. F16B 5/0642
                                                              248/546
(Continued)

FOREIGN PATENT DOCUMENTS

DE   102008005823 B4   8/2009
DE   102010008040        8/2011
(Continued)

*Primary Examiner* — Andrew J Coughlin
*Assistant Examiner* — Fatima N Farokhrooz
(74) *Attorney, Agent, or Firm* — Von Rohrscheidt Patents

(57) ABSTRACT

A fastening element for fastening a first component, like a circuit board fitted with LEDs, including a pass through opening with a second component, like a lamp element which includes a recess like e.g. a dead hole or a pass through opening, the fastening element including a shaft which includes at least one spring elastic support element which anchors the fastening element at the second component, a shaft head which has a larger diameter than the shaft, wherein the shaft head is arranged at one end of the shaft, a clamping element which clamps the first component against the second component with a defined contact pressure, wherein the clamping element is formed by a spring elastic clamping arm that is displace able in a spring elastic manner and which forms a portion of the shaft head and which contacts the first component.

8 Claims, 7 Drawing Sheets

(30) Foreign Application Priority Data

Aug. 24, 2013 (DE) .................... 20 2013 007 589 U
Feb. 17, 2014 (DE) .................... 20 2014 001 330 U

(51) Int. Cl.
| | | |
|---|---|---|
| *F16B 5/12* | (2006.01) | |
| *F16B 2/24* | (2006.01) | |
| *F16B 21/08* | (2006.01) | |
| *F21V 29/70* | (2015.01) | |
| *H05K 7/14* | (2006.01) | |
| *F21Y 101/00* | (2016.01) | |

(52) U.S. Cl.
CPC ............ *F16B 5/125* (2013.01); *F16B 21/086* (2013.01); *F21V 29/70* (2015.01); *H05K 7/1417* (2013.01); *F21Y 2101/00* (2013.01)

(58) Field of Classification Search
CPC .... F21Y 2101/00; F16B 19/002; F16B 5/125; F16B 5/128; F16B 2/24; F16B 2/241; F16B 21/086; F16B 37/043
See application file for complete search history.

(56) References Cited

U.S. PATENT DOCUMENTS

| | | | | |
|---|---|---|---|---|
| 2,192,359 | A * | 3/1940 | Lombard | F16B 5/125 220/DIG. 3 |
| 2,238,238 | A | 4/1941 | Westrope | |
| 2,245,375 | A | 6/1941 | Wiley | |
| 2,245,633 | A * | 6/1941 | Wolfe | E04B 1/6803 52/393 |
| 2,265,957 | A | 12/1941 | Tinnermann | |
| 2,430,809 | A | 11/1947 | Flora | |
| 2,451,591 | A * | 10/1948 | Tinnerman | F16B 5/125 24/453 |
| 2,495,848 | A * | 1/1950 | Kiesel | F16B 5/0685 211/89.01 |
| 2,560,530 | A * | 7/1951 | Burdick | F16B 5/06 411/508 |
| 2,594,211 | A | 4/1952 | Poupitch | |
| 3,217,584 | A * | 11/1965 | Amesbury | B21D 53/36 174/250 |
| 3,276,309 | A | 10/1966 | Engstrom | |
| 5,036,567 | A * | 8/1991 | Clinch | F16B 21/086 24/297 |
| 5,115,375 | A * | 5/1992 | Garay | H05K 7/142 361/760 |
| 5,452,499 | A | 9/1995 | Schmidt | |
| 5,846,040 | A | 12/1998 | Veno | |
| 8,573,881 | B2 * | 11/2013 | Spitz | F16B 2/243 24/295 |
| 8,616,516 | B2 * | 12/2013 | Rittner | B64C 1/403 24/453 |
| 2004/0155162 | A1 * | 8/2004 | Schneider | F16B 19/02 248/222.13 |
| 2005/0220560 | A1 | 10/2005 | Shinozaki | |
| 2007/0158931 | A1 * | 7/2007 | Baumgartner | B60R 21/20 280/728.2 |
| 2011/0116890 | A1 | 5/2011 | Okada | |
| 2011/0233359 | A1 * | 9/2011 | Rittner | B64C 1/403 248/231.81 |
| 2014/0109357 | A1 * | 4/2014 | Fischer | F16B 2/243 24/455 |

FOREIGN PATENT DOCUMENTS

| | | |
|---|---|---|
| DE | 202012002831 | 4/2012 |
| DE | 102012003520 B4 | 8/2013 |
| DE | 202013006326 U1 | 9/2013 |
| DE | 202014001330 U1 | 4/2014 |
| DE | 202013006325 U1 | 11/2014 |
| DE | 202013007589 U1 | 1/2015 |
| EP | 0348258 | 12/1989 |
| FR | 789664 | 11/1935 |
| FR | 1417603 | 12/1965 |
| FR | 2064487 | 7/1971 |
| FR | 2790048 | 8/2000 |
| FR | 2928428 | 9/2009 |
| WO | WO2005071273 A1 | 8/2005 |
| WO | WO2007104530 | 9/2007 |
| WO | WO2011103068 | 8/2011 |
| WO | WO2012166552 | 12/2012 |

* cited by examiner

FASTENING ELEMENT FOR FIXATING TWO COMPONENTS AT EACH OTHER

RELATED APPLICATIONS

This application is a continuation of International Application PCT/DE2014/200230 filed on May 21, 2014 claiming priority from German patent applications
DE 20 2013 006 326.2 filed on Jul. 15, 2013,
DE 20 2013 006 325.4 filed on Jul. 15, 2013,
DE 20 2013 007 589.9 filed on Aug. 24, 2013, and
DE 20 2014 001 330.6 filed on Feb. 17, 2014,
all of which are incorporated in their entirely by this reference.

FIELD OF THE INVENTION

The invention relates to a fastening element for fixating a first component such as a printed circuit board fitted with LEDs which includes a pass through opening at a second component such as a lamp element which includes a recess such as a dead hole or a pass through opening, the fastening element including
  a shaft which includes at least one spring elastic retaining element and which anchors the fastening element at the second component
  a shaft head which has a head diameter that is larger than a shaft diameter, wherein
  the shaft head is arranged at an end of the shaft, and
  a clamping element which clamps the first component against the second component with a defined contact pressure.

BACKGROUND OF THE INVENTION

Fastening elements of this type are not known in the lamp industry. Similar fastening elements, however, exist in the automotive field. Reference is made herein for example to WO 2005/071273 A1. These fastening elements are typically used for attaching inner fairing elements at a vehicle body. Thus, the inner fairing element has a pass through opening for example a bore hole which penetrates the inner fairing element in its entirety. On a side of the body typically a sheet metal component is also provided which includes a bore hole. The pass through opening of the inner fairing element and the bore hole of the vehicle body are matched. Then the fastening element typically also designated as an expanding rivet is Inserted into the bore hole through the pass through opening. Anchoring the expanding rivet in the bore hole at the vehicle body can be performed through friction locking, for example by plastic lamellas which are configured at the shaft of the fastening element interlocking connections are also feasible in that interlocking hooks of the fastening element engage interlocking recesses.

Mass produced lamps are typically produced with LEDs as illuminants today. Particular LED types become more and more common. Thus, it is typical to apply LEDs to printed circuit boards and to provide these as components to the lighting industry for further use. Though materials and shapes of the printed circuit boards vary as well as the LEDs applied thereto with respect to number and distribution, however, an attachment of the printed circuit board at the lamp element is required in any case. An even contact pressure of the printed circuit board at the surface of the lamp element thus provides optimum heat dissipation from the LEDs In the art connecting elements for circuit boards of this type are known from DE 10 2008 005 823 B4 or DE 10 2012 003 520 B4. These connection elements combine circuit board attachment with the option of supplying voltage to the LEDs arranged on the circuit board.

Though these connecting element combining fastening and voltage supply are advantageous in many cases, fastening devices are required for lamps which are useable for widely automated production due to various circuit board designs and various manufacturing methods. It is furthermore necessary that the attachment devices support the circuit board of the LED under a defined contact pressure on the lamp element in order to provide good heat transfer.

BRIEF SUMMARY OF THE INVENTION

This object is achieved by a fastening element for fastening a first component, like a circuit board fitted with LEDs, including a pass through opening with a second component, like a lamp element which includes a recess like e.g. a dead hole or a pass through opening, the fastening element including a shaft which Includes at least one spring elastic support element which anchors the fastening element at the second component, a shaft head which has a larger diameter than the shaft, wherein the shaft head is arranged at one end of the shaft, a clamping element which clamps the first component against the second component with a defined contact pressure, wherein the clamping element is formed by a spring elastic clamping arm that is displaceable in a spring elastic manner and which forms a portion of the shaft head and which contacts the first component, characterized in that the shaft is formed by at least two arms which are fabricated by crimping a piece of sheet metal along a first deformation line that is parallel to a longitudinal shaft axis.

It is an advantage of the invention that the described fastening element provides the option to safely attach a circuit board at a lamp element by simply inserting the shaft through the pass through opening of the printed circuit board and into the recess of the lamp element. Thus, the fastening element is advantageously made from metal and thus formed by crimping a stamped component. This way a high level of material stability is provided for lamp elements that are very small compared to the non related art known in the automotive industry. The attachment elements proposed herein typically have a shaft head with a diameter of 6 mm or less and a shaft length of not more than 7 mm with a diameter of 3 mm at the most.

It is an essential advantage of the invention that the shaft head itself forms the clamping element in that it includes a clamping arm. The clamping function which provides a defined contact of the 2 components, namely the LED circuit board and the lamp element at one another is thus taken over by the clamping head. Additional components which could make production and assembly difficult are omitted.

In particular it is possible this way that the fastening element which is provided by crimping a stamped sheet metal blank which assures efficient fabrication.

It is provided that the clamping arm configured as a portion of the shaft head is sloped downward starting from a shaft longitudinal axis to the surface of the first component, wherein a movement building up a spring reset force is forced upon the clamping arm by contacting a surface of the first component when inserting the fastening element into the recess.

In view of the fact that the shaft head is formed by lobes which are arranged at one end of the shaft and configured so that they contact the surface of the first component it becomes clear that the arms which form the shaft head can be configured as clamping arms so that they perform a double function. On the one hand side the arms retain the fastening element on the first component, on the other hand side the attachment arms apply a clamping force for clamping the two components relative to each other.

In particular it is provided that the shaft is formed by at least two arms which are obtained by crimping a piece of sheet metal along a first deformation line that is parallel to a longitudinal axis of the shaft. It is furthermore provided In a particular embodiment that the arms are obtained by an incision along a deformation line that is parallel to the longitudinal axis of the shaft and crimping the head ends of the arms thus obtained into a position that is suitable for contacting the first component, in particular into a position that is inclined relative to the first component.

An embodiment is particularly advantageous which is characterized in that the incisions separate arm sections in the shaft portion from each other and that at least one of the arm sections can be displaced in a spring elastic manner towards the longitudinal axis of the shaft.

The essential advantage of the spring elastic arm sections of the shaft is that the spring elastic arm sections of the shaft additionally support the clamping function of the shaft head. Thus, when the fastening element moves through the cut out of the first component into the recess of the second component, initially the clamping arms of the shaft head contact the surface of the first component.

When the clamping arms are inclined according to the embodiment described supra from the shaft longitudinal axis towards the surface of the first component they are displaced against the insertion direction X building up a spring reset force and thus already apply a particular clamping force. Additionally a displacement of the spring elastic arm sections of the shaft in a direction of the shaft longitudinal axis building up an additional spring reset force leads to a reinforced clamping force which impacts components that are to be attached at each other.

A third arm is provided which is obtained by crimping the sheet metal along a second deformation line that is parallel to the longitudinal axis of the shaft and wherein the third arm receives the first arm between itself and the second arm, wherein the third arm is advantageously shaped like the second arm, in particular when the arms differ with respect to their length and a free end of the first longer arm which is oriented away from the shaft head forms the support element configured as a spring arm.

It is furthermore provided that the free end of the first longer arm is oriented at least transversal to, advantageously however against an insertion direction x of the shaft through forming.

It is furthermore provided that the free end of the second shorter arm that is oriented away from the shaft head forms a contact surface for the spring arm of the first arm.

It is furthermore provided that an insulation element, for example an elastomeric disc is arranged in a shaft direction below the shaft head. This elastomeric disc advantageously includes a central pass through opening through which the shaft of the fastening element is run. This insulation element initially has the function to insulate the metal head of the fastening element relative to electrically conductive components like e.g. conductor paths. When this is a spring elastic insulating element it can be deformed in a spring elastic manner when inserting the fastening element and it can impart a force that is directed against the insertion direction.

When the shaft is formed by at least two arms as recited supra which are obtained by crimping a piece of sheet metal along a first deformation line that is parallel to the longitudinal axis of the shaft this has a substantial advantage in that the shaft is stabilized this way against bending and kinking forces.

When the arms differ in length and the free end of the first longer arm forms the support element configured as a spring arm and it is furthermore provided that the free end of the first longer arm is formed by crimping at least transversal to, advantageously however against an insertion direction of the shaft, it is assured that the support element configured as a spring arm can be fabricated in a simple and cost effective manner. By connecting the spring arm at the first arm the spring arm can have a length that is greater than the dead hole diameter which influences the spring properties in a positive manner and which prevents a plastic deformation.

The free end of the second shorter arm that is oriented away from the shaft head can form a contact surface for the spring arm of the first arm. The contact surface is thus arranged so that it protects the spring elastic spring arm before it reaches a displacement which exceeds the spring reset force and which causes a plastic deformation. Thus, it is assured that the spring reset force of the spring arm is sufficient to safely support the fastening element in the recess at the lamp element to attach the circuit board at the lamp element.

The shaft head is advantageously formed by arms which are arranged at an end of the shaft that is oriented away from the spring arm, in particular when the arms are obtained by an incision along the deformation line parallel to the shaft longitudinal axis and crimping the head ends of the arms thus obtained into a position that is approximately transversal to the shaft longitudinal axis. When the lobes are inclined with their ends relative to their component they can take over the function of an elastic insulating element when no such insulating element is used and can impart axial clamping forces onto the components. This way it is assured that the attachment element, in particular its head can be produced in a simple and effective manner while crimping the stamped blank.

In order to further improve stability of the shaft of the fastener element it is provided that a third arm is provided which is obtained by deforming the sheet metal along a second deformation line that is parallel to the longitudinal axis of the shaft and which receives the first arm between itself and the second arm. Thus, it is provided that the third arm corresponds to the second arm with respect to its configuration. Furthermore an embodiment is preferred which is characterized in that the shaft formed from the three arms has an approximately triangular cross section.

BRIEF DESCRIPTION OF THE DRAWINGS

Further advantages and a better comprehension of the invention are apparent from the subsequent description of an embodiment with reference to the drawing figures, wherein.

DETAILED DESCRIPTION OF THE INVENTION

Figure 1:
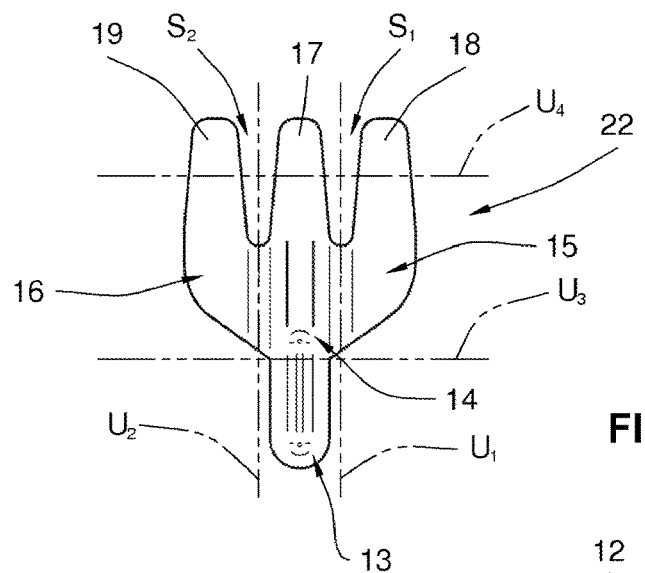
FIG. 1 illustrates a stamped blank for producing a fastener element according to the invention.
Figure 2:
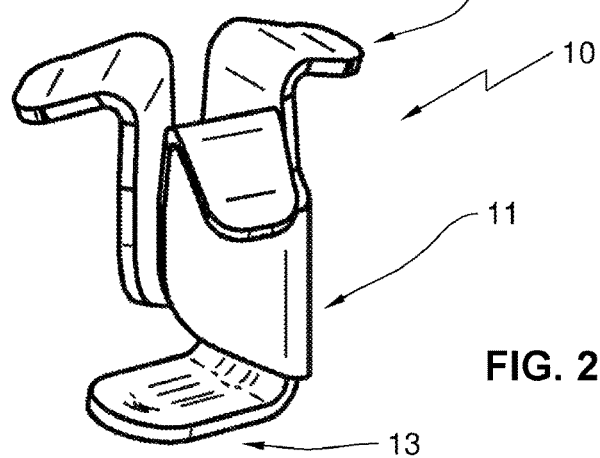
FIG. 2 illustrates the fastener element according to the invention after deforming the stamped blank.
Figure 3:
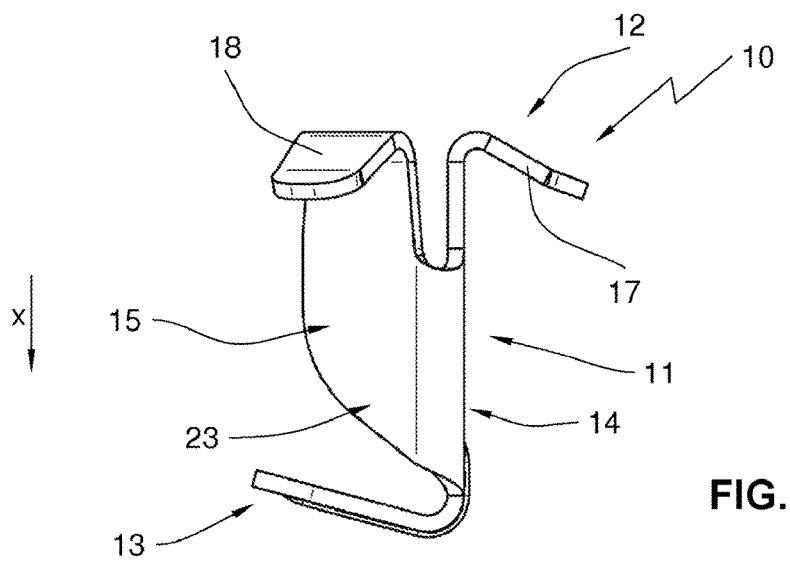
FIG. 3 illustrates the fastening element according to FIG. 2 in a first side view.
Figure 4:
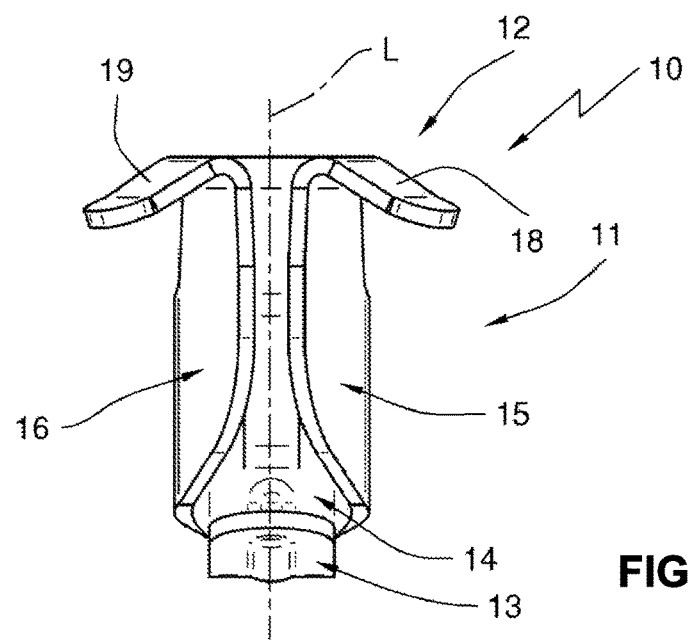
FIG. 4 illustrates the fastening element according to FIG. 2 in a second side view.

A fastening element according to the invention is designated overall with the reference numeral 10 and illustrated in a first embodiment in FIGS. 1-12.

The fastening element 10 includes a shaft 11, a shaft head 12 which is arranged at an end of the shaft 11 and a spring arm 13 which is supported by a free end of the shaft 11 which is arranged opposite to the shaft head 12.

The shaft 11 is formed by three arms that are Integrally connected in one piece, wherein the first arm has the reference numeral 14, the second arm has the reference numeral 15 and the third arm has the reference numeral 16. The shaft head 12 is formed by three lobes, wherein the first lobe has the reference numeral 17, the second lobe has the reference numeral 18 and the third lobe has the reference numeral 19. The first lobe 17 is part of the first arm 14, the second lobe 18 is part of the second arm 15, and the third lobe 19 is part of the third arm 16. The lobes 17, 18, 19 are thus oriented approximately transversal to a shaft longitudinal axis L and are arranged offset relative to each other in the embodiment illustrated herein under an approximately identical circumferential angle. In particular the lobes 17, 18, 19 are sloped from the shaft longitudinal axis L in a direction of the surface of the first component 24 and configured spring elastic. The lobes 17, 18, 19 are provided to contact the first component 24.

The fastening element 10 according to the invention is formed from the stamped blank 22 of a piece of sheet metal. The stamped blank is illustrated in FIG. 1. By crimping along the deformation lines U1 and U2 which extend along the longitudinal axis of the shaft the three arms 14, 15, 16 are formed. The second arm 15 and the third arm 16 receive the first arm 14 between each other. Thus, the second arm 15 and the third arm 16 are configured shortened relative to first arm 14 at an end oriented towards the spring arm 13. The deformation for obtaining the second arm 15 and the third arm 16 thus occurs in the same direction, wherein both arms are oriented towards each other with their free outer edges oriented parallel to the shaft longitudinal axis.

The shaft head 12 or its three lobes 17, 18, 19 are obtained by providing the stamped blank with two incisions S1 and S2. The incisions are introduced at an end of the press blank 22 oriented away from the spring arm 13 along the deformation lines U1 and U2. The depth of the incisions S1 and S2 thus exceeds a length of the lobes. Subsequently the lobes 17, 18, 19 have to be shaped along the deformation line U4 until they are oriented approximately transversal to the shaft longitudinal axis L and are oriented away from the shaft longitudinal axis L. The deformation line U4 is oriented approximately transversal to the shaft longitudinal axis L.

The spring arm 13 is obtained in that the section of the first arm 14 which is extended relative to the arms 15 and 16 is bent over along the deformation line U3 until this section is oriented against an insertion direction X of the fastening element 10. Thus the spring arm 13 is oriented along the free longitudinal edges of the second and third arm 15, 16. The lower narrow sides 23 of the shorter arms 15, 16 form a contact surface for the spring arm 13 wherein the contact surface forms an end point of a spring elastic deflection movement of the spring arm 13 when inserting the fastening element 10 into the recess of a lamp element 25 so that the spring arm 13 is protected against a plastic deformation.

Figure 6:
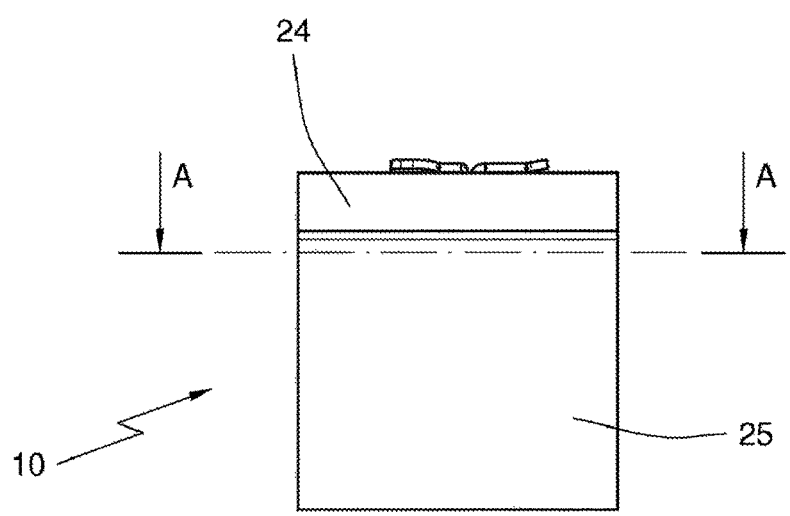
FIG. 6 illustrates a side view of the fastening element in an installed condition.
Figure 7:
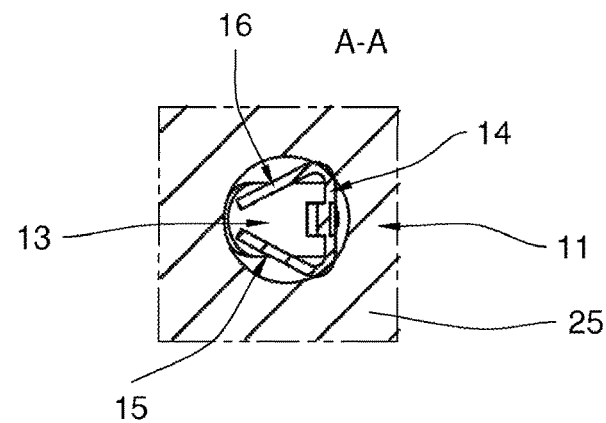
FIG. 7 illustrates a sectional view according to the section line A-A in FIG. 6.
Figure 8:
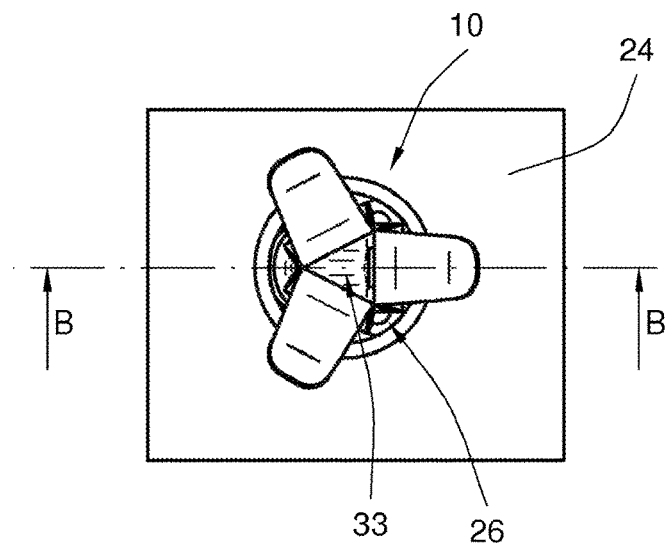
FIG. 8 illustrates a top view of the illustration according to FIG. 6.
Figure 9:
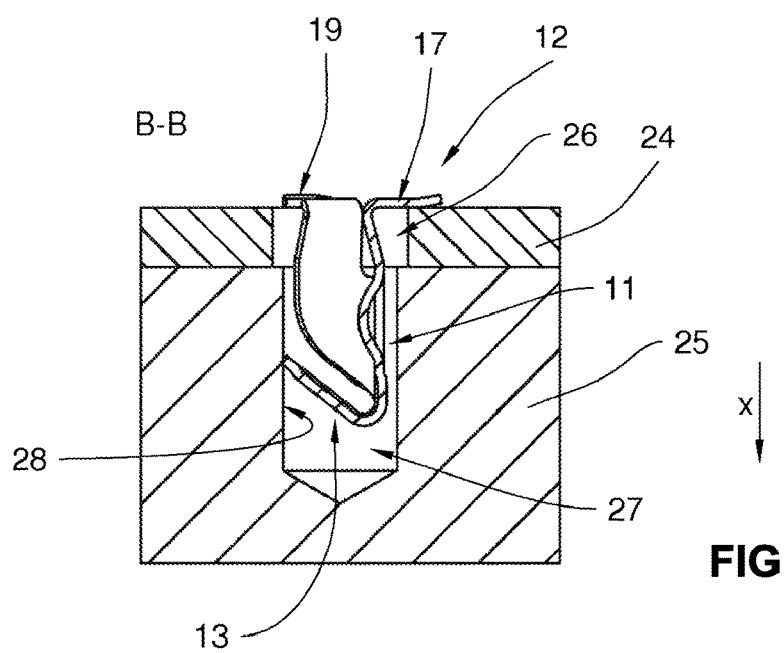
FIG. 9 Illustrates a sectional view along the section line B-B in FIG. 8.

With reference to FIGS. 6-9 a function of the fastening element 10 according to the invention is described in more detail. FIGS. 6 and 8 illustrates the mounting situation of the fastening element 10 in a side view and in a top view. The fastening element 10 supports a printed circuit board 24 on a lamp element 25 In the cited illustrations. As apparent in particular from FIGS. 8 and 9 the printed circuit board 24 includes a pass through opening 26 which is arranged in alignment with a lamp element recess 27 herein configured as a dead hole. The circuit board 24 contacts a top side of the lamp element 25. The fastening element 10 was initially run through the pass through opening 26 in insertion direction x with the spring arm 13 forward and inserted into the dead hole recess 27. Thus, the spring arm 13 impacts the wall 28 of the recess 27 and is displaced by the wall 28 in a spring elastic manner in a direction towards the first shaft arm 14. Thus, a spring force is generated that is oriented against the displacement, wherein the spring force presses the spring arm 13 against the wall 28 and thus establishes a friction locking connection between the fastening element 10 and the recess 27. This friction locking supports the fastening element 10 against movements against the insertion direction x. An Interlocking connection is conceivable when the recess 27 is provided with an inner circumferential groove or a thread that is cut in.

The shaft head 12 which has a larger diameter than the pass through opening 26 and the recess 27 contacts the circuit board top side. The shaft head retains the circuit board 24 on the light element 25 In this manner.

The shaft head 12 thus represents the clamping element 1. In detail its lobes 17, 18, 19 respectively form a clamping arm. The lobes are pressed into the recess 27 against the circuit board 24 when inserting the fastening element 10. Thus, the lobes 17, 18, 19 are deflected, in a spring elastic manner from the idle positions inclined relative to the circuit board 24 against the insertion direction x. The lobes impart a force onto the conductor plate 24, wherein the force is directed against the insertion direction x and they clamp the circuit board 24, the spring arm 13 is used as a reaction bearing, in a defined manner against the lamp element 25. This is advantageous in that a defined heat transfer can be obtained through the defined contact pressure force between the circuit board 24 and the lamp element 25, wherein the heat transfer provides heat dissipation from the circuit board 24 and thus from the LEDs not illustrated herein to the lamp element 25 which is used as a cooling element.

It is evident from FIG. 7 which represents a sectional view according to the sectional line A-A in FIG. 6 that the shaft arms 14, 15, 16 provide an approximately triangular cross sectional contour to the shaft based on their arrangement relative to each other when the lobe depth is extended far enough so that the free edges that are parallel to the longitudinal shaft axis of the second and third shaft lobe 15, 16 contact each other. Alternatively also here an approximately trapezoid cross sectional contour is provided when the free edges of the second and third shaft lobe 15, 16 which edges are parallel to a longitudinal axis of the shaft are connected with one another by a straight line as illustrated in FIG. 7.

FIGS. 10-13 illustrate the assembly method for the fastening element 10 using a mounting tool 29 as well as a dismounting method using a dismounting tool 30.

Figure 10:
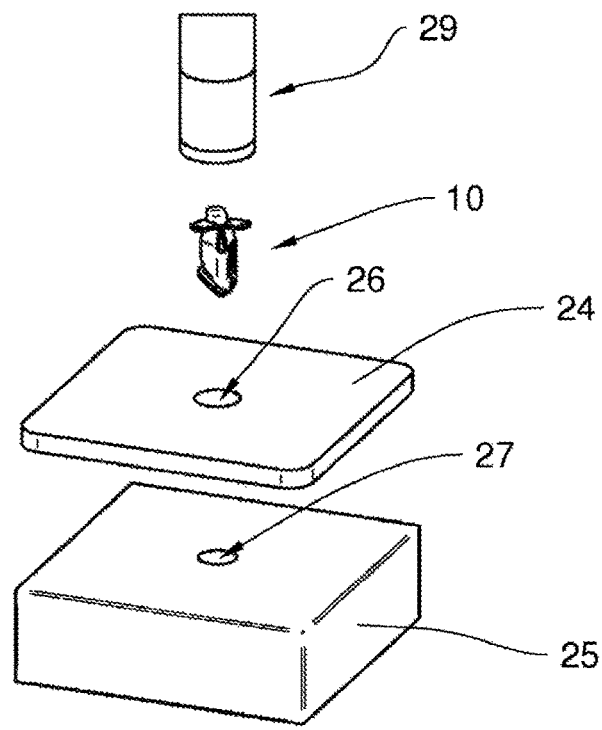
FIG. 10 illustrates an exploded view of lamp element, circuit board and fastening element and an assembly tool.
Figure 11:
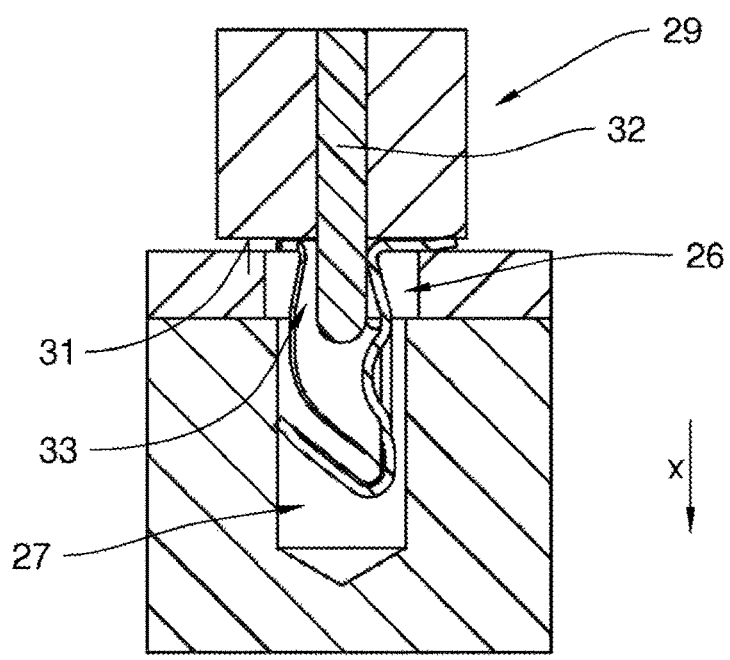
FIG. 11 illustrates a vertical sectional view for illustrating the effect of the assembly tool.
Figure 12:
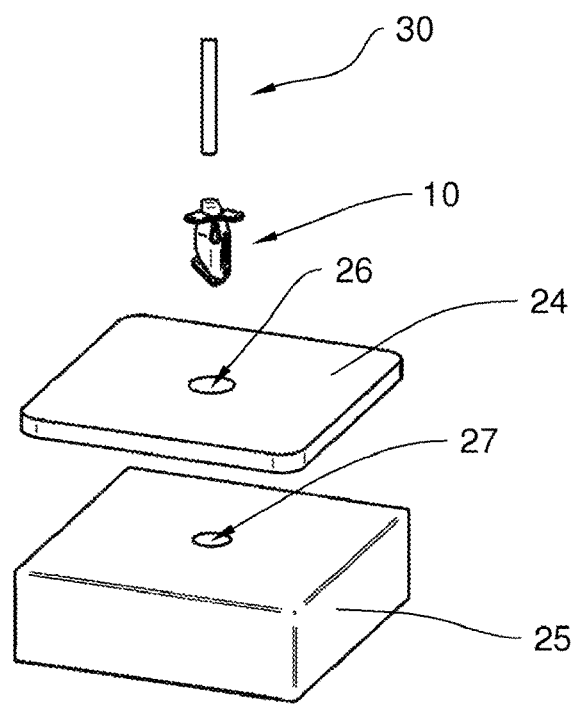
FIG. 12 illustrates the representation according to FIG. 10, however with a disassembly tool.
Figure 13:
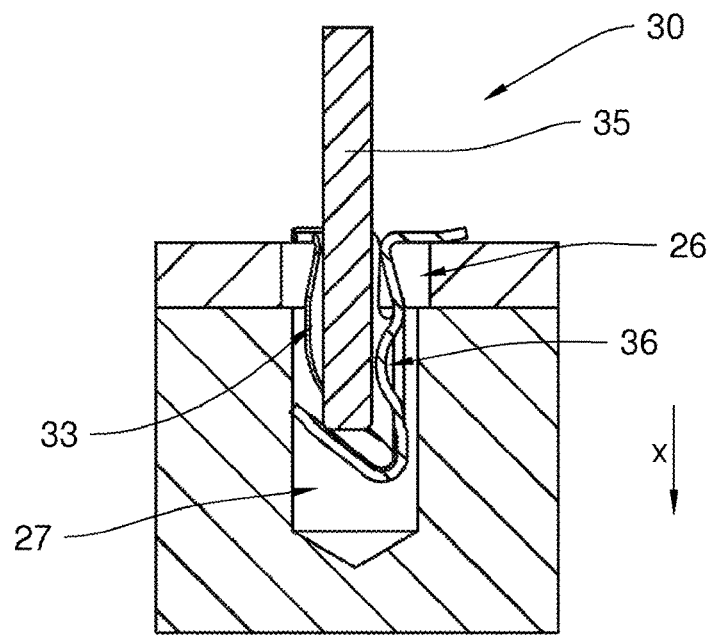
FIG. 13 illustrates the disassembly process.
Figure 14:
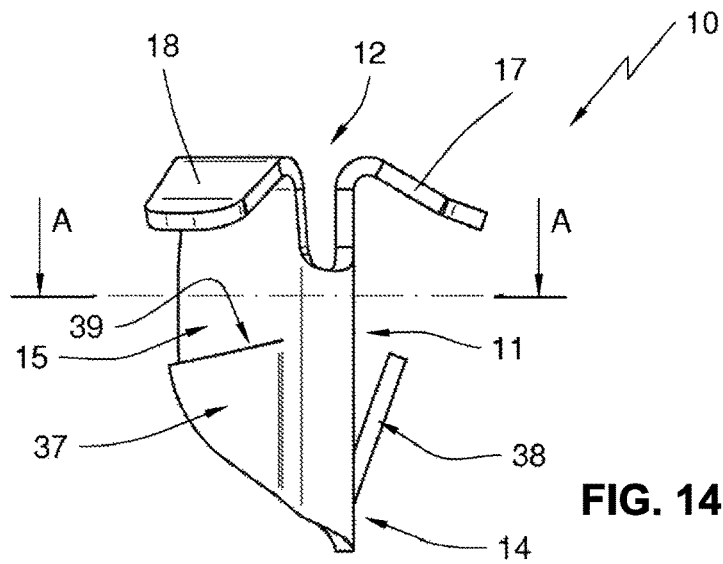
FIG. 14 illustrates an alternative embodiment of the fastening element according to the invention in a first side view.
Figure 15:
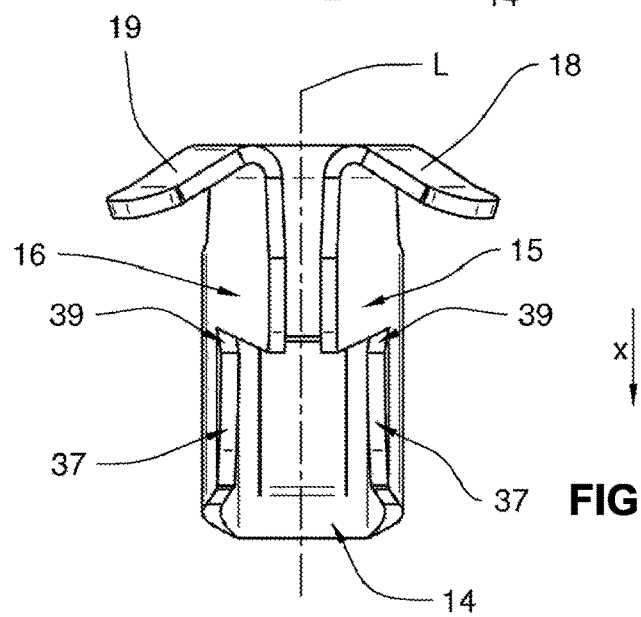
FIG. 15 illustrates the fastening element according to FIG. 14 in a second side view.
Figure 16:
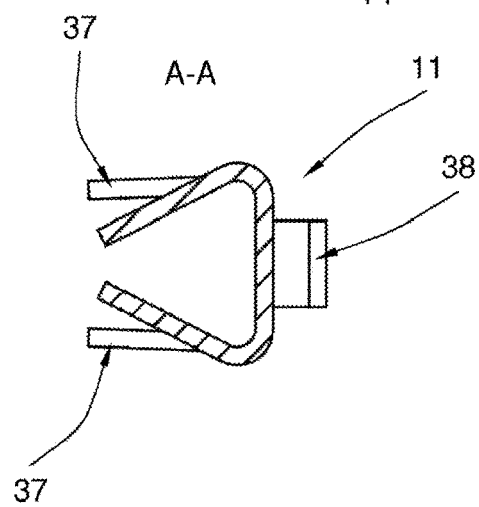
FIG. 16 illustrates the fastening element in a sectional view according to the section line A-A In FIG. 14.
Figure 17:
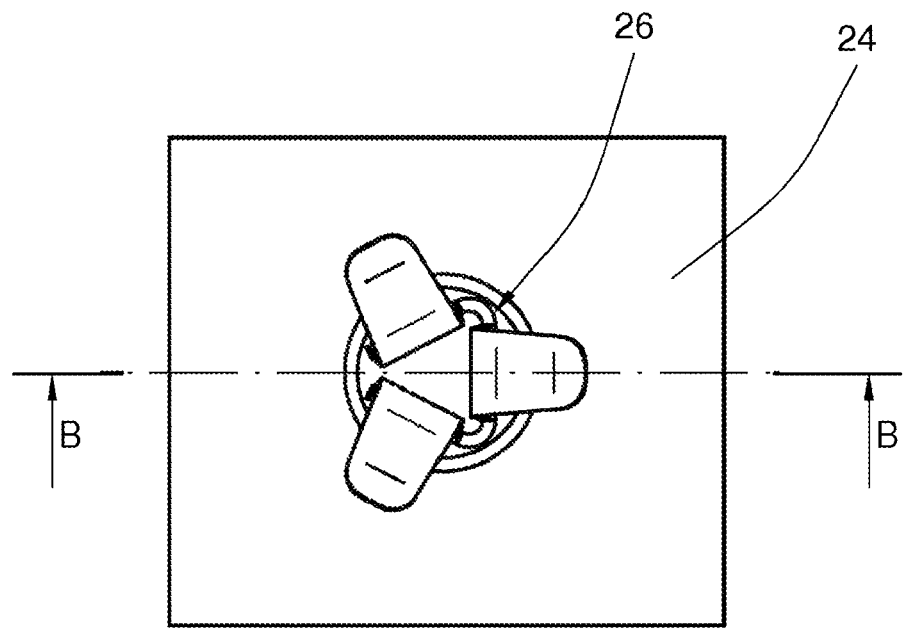
FIG. 17 illustrates a top view of the fastening element according to FIG. 14 in a mounted configuration.
Figure 18:
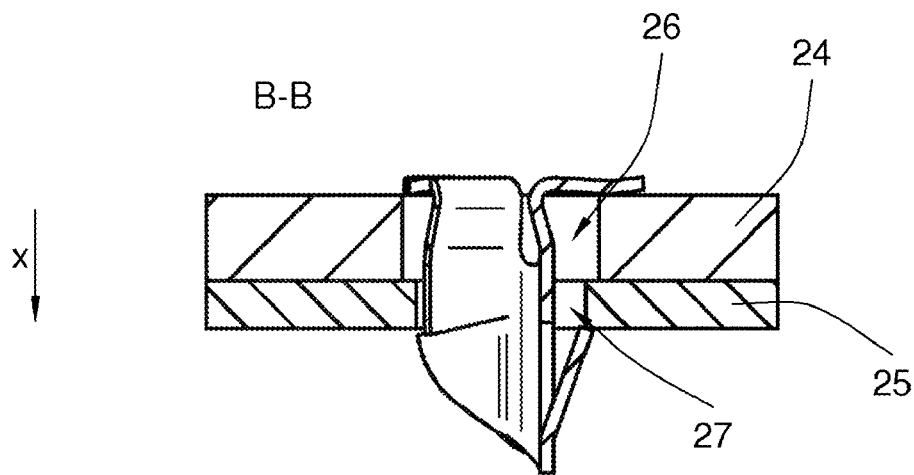
FIG. 18 illustrates a sectional view according to the section line B-B in FIG. 17.

FIGS. 10 and 12 illustrate an exploded view of the mounting situation and the dismounting situation of the fastening element 10. FIGS. 11 and 13 essentially correspond to the exploded view according to FIG 9, however they additionally show a mounting tool 29 or a dismounting tool 30.

Figure 5:
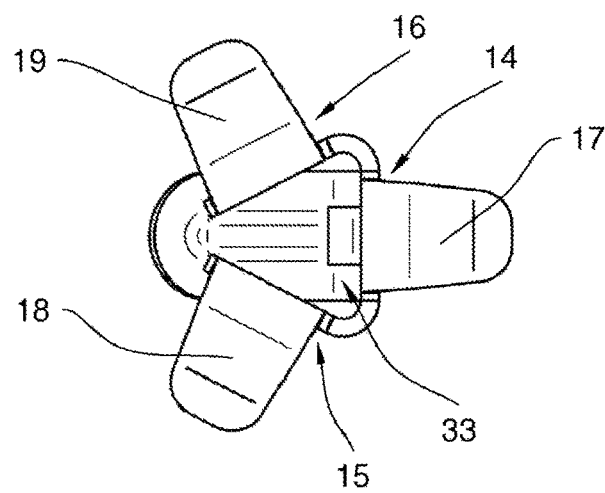
FIG. 5 illustrates a top view of the fastening element according to FIG. 2.

The mounting tool 29 according to FIGS. 10 and 11 is configured as a plunger whose operating surface 31 oriented towards the circuit board includes a recess for receiving the shaft head 12. A centering mandrel 32 that is parallel to the longitudinal shaft axis extends from the operating surface 31, wherein the centering mandrel 32 engages a centering opening 33 at the shaft head (c.f. FIG. 5, 8, 11). The operating surface 31 can be magnetized in order to support the shaft head in the mounting tool 29. Thus, it is also conceivable that the centering mandrel 32 is supported friction locking in the centering opening 33 so that the centering mandrel support the fastening element 10 at the mounting tool 29.

In order to mount the fastening element 10 the fastening element 10 is applied to the operating surface 31 of the mounting tool 29 and introduced with the shaft 11 forward through the pass through opening 26 of the circuit board 24 into the recess 27 of the lamp element 25. The lobes 17, 18, 19 of the shaft head 11 that are inclined relative to the surface of the circuit board 24 impact the top side of the circuit board and are displaced building up a spring reset force. After completing the Insertion movement the spring arm supports the fastening element 10 in the recess 27 against the spring reset force of the lobes 17, 18, 19. The spring reset force thus clamps the components 24 and 25 relative to each other.

One embodiment provides that only the shaft lobes 17, 18, 19 build up the spring reset force in that they are displaced against the insertion direction x until they are approximately in a horizontal position that is parallel to the top side of the circuit board 24. However when incisions S1 and S2 like in the illustrated embodiment are deeper than a length of the lobes 17, 18, 19 they separate the sections of the arms 14, 15, 16 from each other that are proximal to the shaft head. The arm sections are also displaceable from each other in a spring elastic manner and thus in a direction towards the shaft longitudinal axis L. When inserting the fastening element 10 into the recess 27 the arm sections are moved by the respective lobes 17, 18, 19 and by the insertion force impacting the lobes in a direction of the longitudinal shaft axis L. The spring reset force of the arm sections thus applied clamps the components 24 and 25 through the lobes 17, 18, 19. A respective lobe 17, 18, 19 forms a respective clamping arm with the associated arm section.

Thus, it is even possible to configure the arm sections spring elastic and to omit a spring force of the lobes 17, 18, 19.

After removing the mounting tool 29 the mounting process is completed.

Also for dismounting the fastening element 10 a tool is provided. The tool has the reference numerals 30 and includes a disengagement mandrel 35 which is pressed through a centering opening 33 of the fastening element 10 into a receiving cavity 27 in order to disengage the fastening element 10. Thus, the disengagement mandrel 35 impacts the spring arm 13 and presses the spring arm 13 from its anchoring position in an insertion direction causing a plastic deformation of the spring arm 13. Thus, the friction locking between the spring arm 13 and the wall 28 is disengaged from the recess 27 and the fastening element 10 can be removed from the recess 27. This is advantageously also performed by the dismounting tool 30 in that inserting the disengagement mandrel 35 through the centering opening 33 into a shaft interior causes a friction locking connection between the shaft arms 14, 15 and 16 and the outer surface of the disengagement mandrel 35. This way the fastening element 10 follows the disengagement mandrel 35 when it is removed from the recess 27.

The guide embossing 36 of the first arm 14 will now be appreciated (FIG. 13). This guide embossing forces the disengagement mandrel 35 towards the free end of the spring arm 13 so that the disengagement mandrel 35 deforms the spring arm 13 in the insertion direction. Thus, the guide embossing 36 prevents that the disengagement mandrel 35 slips on the spring arm 13 in a direction towards its deformation range which would generate a risk that the shaft 11 is pressed deeper into the recess 27 instead of providing a disengaging deformation of the spring arm 13.

FIGS. 14-18 illustrate a second embodiment of the invention. The fastening element 10 is quite similar to the fastening element 10 according to the first embodiment. Therefore identical reference numerals are used for analogous components and reference is made to the preceding description. Subsequently mostly differences between both embodiments are discussed.

The fastening element 10 according to the second embodiment is also formed from a stamped blank, however it includes a shaft with a shaft head 12, wherein the shaft 11 and the shaft head 12 are formed according to the first embodiment. In particular the shaft 11 includes three shaft arms 14, 15 and 16 and the shaft head 12 is formed by three lobes 17, 18 and 19. Also in this embodiment the shaft head 12 with its lobes 17, 18 and 19, optionally using shaft arm sections that are divided from each other by incisions S1 and S2, is used as a clamping element. As can be derived from FIG. 16 the shaft 11 is essentially formed as a triangle or trapezoid which significantly improves stability.

The essential difference between both embodiments can be found in the support elements of the second embodiment. The first embodiment is provided in particular for fixation in a dead hole of a lamp element 25 and therefore includes only one spring arm 13 which mostly provides a friction locking engagement in the dead hole.

The fastening element 10 according to FIGS. 14-18, however, is provided for interlocking fixation. For this purpose at least one of the shaft arms 14, 15 and 16 includes an interlocking element 37, 38. In the present embodiment the shaft arms 15 and 16 respectively include an interlocking arm 37, the shaft arm 14 includes a interlocking spring 38.

The interlocking elements 37, 38 are displaced relative to the shaft arms 14, 15 and 16 so that a circumference is expanded and they are displaced from their idle position in a spring elastic manner when they penetrate the pass through opening 26 in a direction of the longitudinal shaft axis L. The same occurs when the interlocking elements 37, 38 penetrate the portion of the recess 27 of the lamp element 25.

Also the recess 27 of the lamp element 25 is configured as a pass through opening in the second embodiment so that the end section of the shaft 11 that is oriented away from the shaft head 12 can not only penetrate the pass through opening 26 of the circuit board but also the recess of the lamp element 25. During this insertion process in the insertion direction x the lobes 17, 18 and 19 forming the shaft head and/or the shaft arm sections that are divided from each other by the incisions S1 and S2 go through a spring elastic displacement and thus build up tension forces which generate a defined contact pressure between the circuit board 24 and the lamp element 25. The insertion process in the insertion direction is performed until the interlocking arms 37 and the interlocking spring 38 have moved through the recess 27 and move back Into their resting positions, in this resting position the interlocking arms 37 and the interlocking spring 38 reach behind or below the bottom side of the lamp element 25 and thus fixate the components 24 and 25 at each other. This can be derived in particular from FIG. 18.

It is appreciated that the second embodiment only provides an alternative fixation of the fastening element 10 in the recess 27, however the function and configuration of the damping element by the lobes 17, 18 and 19 of the shaft head 12 and/or the shaft arm sections that are separated from each other are configured identical to the first embodiment.

The bevel 39 at the interlocking arms 37 can be used to compensate certain tolerances in the total thickness of the components 24 and 25 without significantly influencing the clamping function that is provided by the lobes 17, 18 and 19. Especially during the typical use of plural fastening elements 10 the evenness of the individual damping forces is an essential feature for a contact pressure over an entire surface.

REFERENCE NUMERALS AND DESIGNATIONS 10 fastening element
11 shaft
12 shaft head
13 spring arm
14 first arm
15 second arm
16 third arm
17 first lobe
18 second lobe
19 third lobe
20 insulating element
21 perforation
22 stamped blank
23 narrow sides
24 circuit board
25 lamp element
26 pass through opening
27 recess
28 wall
29 mounting tool
30 dismounting tool
31 operating surface
32 centering mandrel
33 centering opening
35 disengagement mandrel
36 guide embossing
37 interlocking arm
38 interlocking spring
39 bevel of 37
L longitudinal shaft axis
U1 deformation line 1
U2 deformation line 2
U3 deformation line 3
U4 deformation line 4
S1 incision 1
S2 incision 2
x insertion direction

What is claimed is:

1. A fastening element or fastening a first component at a second component, the fastening element comprising:
   a shaft which includes a first end and a second end that is arranged opposite to the first end
   a shaft head which has a larger diameter than the shaft and which is arranged at the first end of the shaft;
   a spring arm that is arranged at the second end of the shaft and that anchors the fastening element at the second component; and
   three spring elastic clamping lobes which clamp the first component against the second component with a defined mechanical contact pressure,
   wherein the first component is a circuit board which is fitted with LEDs and includes a first pass through opening and the second component is a lamp element which includes a recess which is configured as a dead hole or a second pass through opening,
   wherein the three spring elastic clamping lobes are displaceable in a spring elastic manner and forms a portion of the shaft head and contacts a surface of the first component,
   wherein the shaft is formed by at least two arms which are fabricated by crimping a piece of sheet metal along a first deformation line that is parallel to a longitudinal axis of the shaft,
   wherein the spring arm extends across the first pass through opening starting from the shaft, and
   wherein the shaft head is formed by the three spring elastic clamping lobes that form a triangular configuration in top view and that are arranged at the first end of the shaft.

2. The fastening element according to claim 1,
   wherein the three spring elastic clamping lobes form a portion of the shaft head and are sloped downward from the longitudinal axis of the shaft towards a surface of the first component, and
   wherein the three spring elastic clamping lobes are forced into a movement that builds up a spring reset force through contacting the surface of the first component when the fastening element is inserted into the recess.

3. The fastening element according to claim 1. wherein the three spring elastic lobes are fabricated by an incision along a deformation line that is parallel to the longitudinal axis of the shaft and by deforming head ends of the at least two arms thus obtained into a position where the head ends of the at least two arms contact the surface of the first component and where the head ends of the at least two arms are inclined relative to the first component.

4. The fastening element according to claim 1,
   wherein a third arm is provided which is fabricated by deforming the piece of sheet metal along a second deformation line which is parallel to the longitudinal axis of the shaft and which receives a first arm of the at least two arms between the third arm and a second arm of the at least two arms, and wherein the third arm has a configuration that corresponds to a configuration of the of the second arm of the at least two arms.

5. The fastening element according to claim 1, wherein the at least two arms differ length and a free end of a first longer arm of the at least two arms oriented away from the shaft head forms a support element configured as the spring arm.

6. The fastening element according to claim 3, wherein the incisions separate arm sections of the at least two arms from each other in a portion of the shaft, and wherein at least one of the arm sections is displaceable in a spring elastic manner to the longitudinal axis of the shaft.

7. The fastening element according to claim 5, wherein the free end of the first longer arm of the least two arms is oriented through crimping transversal to an insertion direction of the shaft or opposite to an insertion direction of the shaft.

8. The fastening element according to claim 5, wherein a free end of a second shorter arm of the least two arms oriented away from the shaft head forms a contact surface for the spring arm of the first longer arm.

* * * * *